(12) United States Patent
Miyanaga et al.

(10) Patent No.: US 7,390,359 B2
(45) Date of Patent: Jun. 24, 2008

(54) NITRIDE SEMICONDUCTOR WAFER

(75) Inventors: Michimasa Miyanaga, Itami (JP); Koji Uematsu, Itami (JP); Takuji Okahisa, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/612,481

(22) Filed: Dec. 19, 2006

(65) Prior Publication Data
US 2007/0096117 A1    May 3, 2007

(30) Foreign Application Priority Data
Oct. 6, 2004    (JP)    ............................. 2004-293844

(51) Int. Cl.
*C30B 25/12*    (2006.01)

(52) U.S. Cl. ................................. 117/2; 117/3; 117/902; 423/328.2

(58) Field of Classification Search ..................... 117/2, 117/3, 902; 423/328.2
See application file for complete search history.

(56) References Cited

FOREIGN PATENT DOCUMENTS

| | | |
|---|---|---|
| JP | 2003-527296 A | 9/2003 |
| JP | 2004-502298 A | 1/2004 |

*Primary Examiner*—Felisa C. Hiteshew
(74) *Attorney, Agent, or Firm*—James W. Judge

(57) ABSTRACT

A nitride semiconductor substrate having properties preferable for the manufacture of various nitride semiconductor devices is made available, by specifying or controlling the local variation in the off-axis angle of the principal surface of the nitride semiconductor substrate. In a nitride semiconductor single-crystal wafer having a flat principal surface, the crystallographic plane orientation of the principal surface of the nitride semiconductor single-crystal wafer varies locally within a predetermined angular range.

6 Claims, 1 Drawing Sheet

NITRIDE SEMICONDUCTOR WAFER

BACKGROUND OF THE INVENTION

1. Technical Field

The present invention relates generally to nitride semiconductor substrates (wafers), and in particular to nitride semiconductor substrates that are especially utilizable in the manufacture of such components as light-emitting elements, electronic devices, semiconductor sensors, and surface acoustic wave devices.

2. Description of the Related Art

Components that in recent years are being manufactured using nitride semiconductors include: light-emitting elements such as light-emitting diodes and laser diodes; electronic devices such as rectifiers, bipolar transistors, field-effect transistors, and HEMTs (high electron mobility transistors); semiconductor sensors such as temperature sensors, pressure sensors, radiation sensors, and visible/ultraviolet light detectors; and SAW (surface acoustic wave) devices.

As represented in the schematic cross-sectional view of FIG. 3, such nitride semiconductors are manufactured using an epitaxial nitride semiconductor layer 2 (which in some cases includes multiple layers) having favorable crystalline properties that is grown epitaxially on the principal surface 1S of a nitride semiconductor substrate 1.

Japanese Unexamined Pat. App. Pub. No. 2003-527296 discloses an $Al_xGa_yIn_{1-(x+y)}N$ ($0 \leq x \leq 1$, $0 \leq y \leq 1$, $x+y \leq 1$) substrate having a flat principal surface, and states that it is preferable for the plane of the principal surface to have an off-axis angle inclined at an angle in a range of 1 to 10° from a crystallographic $\{0001\}$ plane, $\{11\bar{2}0\}$ plane, $\{10\bar{1}0\}$ plane, or $\{10\bar{1}2\}$ plane.

For example, as illustrated by the schematic cross-sectional view of FIG. 2, when the principal surface 1S of the nitride semiconductor substrate 1 is inclined an angle θ from a low-Miller-index plane CS (for example, a $\{0001\}$ plane) of that nitride semiconductor crystal, such a substrate is referred to as a misoriented substrate. A substrate that has an off-axis angle of 0° may be referred to as an exact substrate.

Also, Japanese Unexamined Pat. App. Pub. No. 2004-502298 discloses an $Al_xGa_yIn_{1-(x+y)}N$ ($0 \leq x \leq 1$, $0 \leq y \leq 1$, $x+y \leq 1$) substrate having a flat principal surface, and states that it is preferable for the plane of the principal surface to have an off-axis angle inclined at an angle in a range of 0.1 to 10° from a crystallographic $\{0001\}$ plane.

In order to manufacture a favorable semiconductor device by epitaxially growing a flat and thin nitride semiconductor layer on a nitride semiconductor substrate, it is preferable to use a flat substrate face having a crystallographic low-Miller-index plane (θ=0°) or a predetermined off-axis angle (θ≠0°) relative to that plane.

However, a problem with such nitride semiconductor substrates is that from region to region locally along the substrate principal surface, characteristics such as optical, electrical, and mechanical properties are inadequate or variations occur.

Also, finding the optimum substrate misorientation angle for epitaxially growing a nitride semiconductor layer onto a nitride semiconductor substrate face to manufacture a favorable semiconductor device is not a simple matter.

The reason for this difficulty is that, as illustrated in the schematic cross-sectional view in FIG. 1, without local variation Δθ in the off-axis angle θ of the principal surface 1S of the nitride semiconductor substrate 1 being set down or controlled, variation Δθ in the off-axis angle will differ from substrate to substrate, or the value of Δθ will be insufficient (<0.05°) to make the determination as to optimum misorientation angle.

BRIEF SUMMARY OF THE INVENTION

The present invention was brought about in view of the conventional technology as described above, and it is an object thereof to provide a nitride semiconductor substrate having choice properties for the manufacture of various nitride semiconductor devices, by specifying or controlling the local variation Δθ in the off-axis angle θ of the principal surface 1S of the nitride semiconductor substrate 1.

According to the present invention, in a nitride semiconductor single-crystal wafer having a flat principal surface, crystallographic plane orientation of that principal surface varies locally within a predetermined angular range.

It should be understood that the nitride semiconductor can be constituted from $Al_xGa_yIn_{1-(x+y)}N$ ($0 \leq x \leq 1$, $0 \leq y \leq 1$, $x+y \leq 1$).

Also, it is preferable that the crystallographic plane orientation of the principal surface of the nitride semiconductor single-crystal wafer varies locally within an angular range of greater than 0.05° to less than 1°.

Further, the crystallographic plane orientation of the principal surface of the nitride semiconductor single-crystal wafer may vary locally within an angular range of not less than 1°.

According to the present invention, it is possible to provide a nitride semiconductor substrate having properties preferable for the manufacture of various nitride semiconductor devices by specifying or controlling the local variation Δθ in the off-axis angle θ of the principal surface 1S of the nitride semiconductor substrate 1. Using such a nitride semiconductor single crystal substrate according to the present invention, it is possible to manufacture, for example, light-emitting elements, electronic devices, semiconductor sensors, and SAW devices with excellent properties using a high quality epitaxial nitride semiconductor layer grown on the nitride semiconductor single crystal substrate.

From the following detailed description in conjunction with the accompanying drawings, the foregoing and other objects, features, aspects and advantages of the present invention will become readily apparent to those skilled in the art.

DETAILED DESCRIPTION OF THE INVENTION

Figure 1:
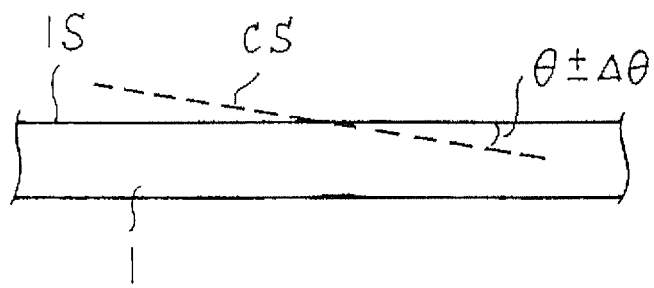
FIG. 1 is a schematic cross-sectional view representing the variation Δθ in off-axis angle θ relative to a crystallographic low-Miller-index plane CS in a principle surface 1S of a nitride semiconductor substrate 1.
Figure 2:
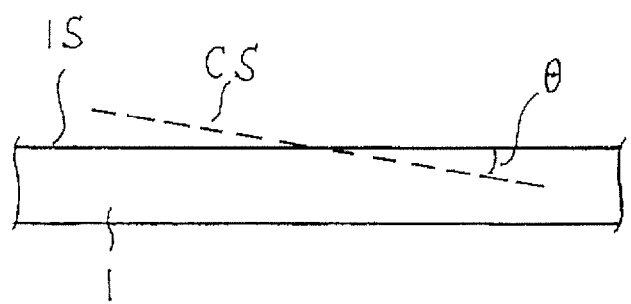
FIG. 2 is a schematic cross-section diagram representing off-axis angle θ relative to a crystallographic low-Miller-index plane CS in a principle surface 1S of a nitride semiconductor substrate 1.
Figure 3:
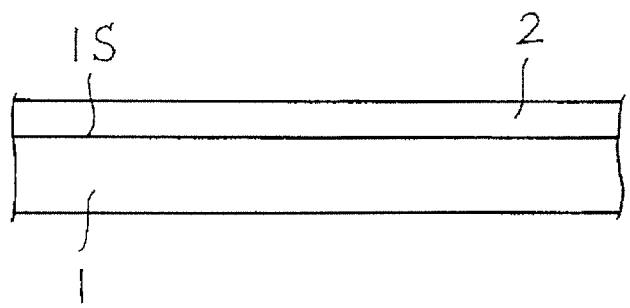
FIG. 3 is a schematic cross-sectional view representing an epitaxial nitride semiconductor layer 2 grown on a principle surface 1S of a nitride semiconductor substrate 1.

The inventors discovered that in a nitride semiconductor substrate of, for example, $Al_xGa_yIn_{1-(x+y)}N$ ($0 \leq x \leq 1$, $0 \leq y \leq 1$, $x+y \leq 1$), having a physically flat principal surface, by controlling local variation Δθ in off-axis angle θ within that principal surface, predetermined choice properties are obtained for a substrate, as described below.

First Embodiment

Δθ Less Than 1°

A nitride semiconductor substrate implementation in which the variation Δθ in off-axis angle θ is greater than 0° and less than 1°, makes it possible to obtain a substrate having uniform optical and electrical properties equal to those of the situation in which Δθ=0°, in which case there is absolutely no variation in the off-axis angle θ. In this implementation, the variation Δθ in the off-axis angle θ preferably is less than 0.5°. In the case of a nitride semiconductor substrate in which the variation Δθ in the off-axis angle θ is more than 0.05°, the direction of splitting due to cleavage of the nitride semiconductor substrate is dispersed, so mechanical properties with good resistance to cracking and breakage when processing and cutting the substrate are obtained. In this case, not less than 0.1° is preferable.

The variation Δθ in the off-axis angle θ can, for example, be obtained by measuring the off-axis angle θ in 5-mm intervals using XRD (X-ray diffraction) on the principle surface of a wafer with a two-inch diameter, and taking the variation Δθ in the measured off-axis angle θ.

A nitride semiconductor substrate in which the variation Δθ in the off-axis angle θ is greater than 0.05° and less than 1° can be manufactured by, for example, designing such that during epitaxial growth using a technique such as a sublimation or HVPE (halide vapor phase epitaxy), the amount of warping of the substrate due to such causes as heat expansion is within the above off-axis angle distribution range, and afterward processing the upper and lower faces of the substrate to be flat. In a range of not less than 50% of the principle surface of that substrate (mainly excluding the peripheral margin), the dislocation density can be brought to $10 \times 10^7$ cm$^{-2}$ or less, and more preferably can be brought to $10 \times 10^5$ cm$^{-2}$ or less.

Second Embodiment

Δθ Not Less Than 1°

By performing epitaxial growth on the principal surface of a nitride semiconductor substrate in which the variation Δθ in the off-axis angle θ is not less than 1°, it is possible to efficiently identify the optimum off-axis angle of the nitride semiconductor substrate under exactly the same conditions as the conditions of actual production with a furnace in which an actual device structure is manufactured. That is, a nitride semiconductor substrate in which the variation Δθ in the off-axis angle θ is not less than 1° can be used as a substrate for finding the optimum off-axis angle θ.

Described more specifically, a satisfactory epitaxial growth layer is not obtained using the same substrate off-axis angle θ in all production devices; the optimum off-axis angle θ for the nitride semiconductor in a particular device changes depending on various factors, such as temperature, gas density, and gas flow rate. Given this understanding, by using, for example, a nitride semiconductor substrate that has a spherically processed surface (in which the off-axis angle θ changes continuously), it is possible to find the optimum off-axis angle θ for the nitride semiconductor substrate. However, when the substrate surface is curved, since the gas flow in the vicinity of the curved substrate surface is not the same as the gas flow in the vicinity of a substrate principle surface that is flat, the found off-axis angle θ substrate may not be appropriate.

On the other hand, employing a nitride semiconductor substrate having a flat principle surface in which the variation Δθ in the off-axis angle θ is 1° or more, enables the optimum off-axis angle θ under the same gas flow conditions as the actual conditions of production to be found, because the off-axis angle θ varies 1° or more by local region of the flat principal surface.

A nitride semiconductor substrate in which the variation Δθ in the off-axis angle θ is not less than 1° can be manufactured by—in hetero-epitaxial growth using for example HVPE—controlling the surface roughness and amount of warping of the base substrate to fixed values.

Employing a nitride semiconductor substrate according to the present invention as described above, makes it possible to improve the characteristics of: light-emitting elements such as light-emitting diodes and laser diodes; electronic devices such as rectifiers, bipolar transistors, field-effect transistors, and HEMTs; semiconductor sensors such as temperature sensors, pressure sensors, radiation sensors, and visible/ultraviolet light detectors; and also SAW (surface acoustic wave) devices.

Also, with the nitride semiconductor substrate according to the present invention, the dislocation density of the nitride semiconductor substrate can be reduced to not more than $10 \times 10^7$ cm$^{-2}$ in a range of not less than 50% of the principle surface of the nitride semiconductor substrate (mainly excluding the peripheral margin), and under preferable conditions can be reduced to not more than $10 \times 10^5$ cm$^{-2}$.

Moreover, a nitride semiconductor substrate according to the present invention can be an exact (θ=0°) substrate having as its principle surface a low-Miller-index plane such as a {0001} plane, a {11$\bar{2}$0} plane, a {10$\bar{1}$2} plane, a {10$\bar{1}$0} plane, or a {10$\bar{1}$1} S plane, or the nitride semiconductor substrate according to the present invention can be a misoriented (θ≠0°) substrate having a principle surface sliced inclined in a desired direction from these low-Miller-index planes. Further, in the principle surface of the nitride semiconductor substrate according to the present invention, it is preferable that the surface is processed such that RMS (root-mean-square roughness) is not more than 500 Å within the range of a 10 micron angle (the range of device production).

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A misoriented nitride semiconductor single-crystal wafer having a flat principal surface, the wafer manufactured to have a non-continuous variation Δθ in off-axis angle such that from region to region across the principal surface, Δθ differs within a predetermined angular range.

2. The nitride semiconductor wafer according to claim 1, wherein the nitride semiconductor is composed of $Al_xGa_yIn_{1-(x+y)}N$ ($0 \leq x \leq 1$, $0 \leq y \leq 1$, $x+y \leq 1$).

3. The nitride semiconductor wafer according to claim 2, wherein Δθ varies non-continuously within an angular range of greater than 0.05° and less than 1°.

4. The nitride semiconductor wafer according to claim 2, wherein the variation Δθ in off-axis angle differs by at least 1° from region to region across the principal surface.

5. The nitride semiconductor wafer according to claim 1, wherein Δθ varies non-continuously within an angular range of greater than 0.05° and less than 1°.

6. The nitride semiconductor wafer according to claim 1, wherein the variation Δθ in off-axis angle differs by at least 1° from region to region across the principal surface.

* * * * *